(12) United States Patent
Zhu

(10) Patent No.: US 10,193,005 B2
(45) Date of Patent: Jan. 29, 2019

(54) ALL-ALUMINUM BACK SURFACE FIELD ALUMINUM PASTE FOR CRYSTALLINE SILICON SOLAR CELL AND PREPARATION METHOD THEREOF

(71) Applicant: NANTONG T-SUN NEW ENERGY CO., LTD., Nantong, Jiangsu (CN)

(72) Inventor: Peng Zhu, Jiangsu (CN)

(73) Assignee: NANTONG T-SUN NEW ENERGY CO., LTD., Nantong, Jiangsu (CN)

( * ) Notice: Subject to any disclaimer, the term of this patent is extended or adjusted under 35 U.S.C. 154(b) by 137 days.

(21) Appl. No.: 15/325,734

(22) PCT Filed: Oct. 15, 2015

(86) PCT No.: PCT/CN2015/092014
§ 371 (c)(1),
(2) Date: Jan. 12, 2017

(87) PCT Pub. No.: WO2016/124005
PCT Pub. Date: Aug. 11, 2016

(65) Prior Publication Data
US 2017/0148936 A1    May 25, 2017

(30) Foreign Application Priority Data

Feb. 2, 2015    (CN) .......................... 2015 1 0053429

(51) Int. Cl.
| C03C 4/14 | (2006.01) |
| C03C 8/18 | (2006.01) |
| H01L 31/0224 | (2006.01) |
| H01B 1/22 | (2006.01) |
| C09D 11/033 | (2014.01) |
| C09D 11/106 | (2014.01) |
| C09D 11/52 | (2014.01) |
| H01B 1/02 | (2006.01) |
| C03C 8/22 | (2006.01) |
| C09D 11/037 | (2014.01) |
| C09D 11/10 | (2014.01) |

(52) U.S. Cl.
CPC ........ *H01L 31/022441* (2013.01); *C03C 4/14* (2013.01); *C03C 8/18* (2013.01); *C03C 8/22* (2013.01); *C09D 11/033* (2013.01); *C09D 11/037* (2013.01); *C09D 11/10* (2013.01); *C09D 11/106* (2013.01); *C09D 11/52* (2013.01); *H01B 1/023* (2013.01); *H01B 1/22* (2013.01); *C03C 2204/00* (2013.01); *C03C 2207/00* (2013.01)

(58) Field of Classification Search
CPC ................................ H01B 1/22; H01L 31/022
USPC ........................................... 252/512; 136/256
See application file for complete search history.

(56) References Cited

U.S. PATENT DOCUMENTS

2014/0042375 A1* 2/2014 Kim .......................... C03C 8/10
                                                              252/514
2015/0364615 A1* 12/2015 Rogojina ............. B23K 35/025
                                                              136/256

FOREIGN PATENT DOCUMENTS

| CN | 101555388 A | * 10/2009 | ............... C09J 1/00 |
| CN | 101826564 | 9/2010 | |
| CN | 101931014 | 12/2010 | |
| CN | 201110208995.7 | 12/2011 | |
| CN | 102737751 | 10/2012 | |
| CN | 102903765 | 1/2013 | |
| CN | 103151097 | 6/2013 | |
| CN | 202996849 | 6/2013 | |
| CN | 103219062 | 7/2013 | |
| CN | 103746043 | 4/2014 | |
| CN | 104637568 | 5/2015 | |
| KR | 20120002257 | 1/2012 | |

OTHER PUBLICATIONS

International Search Report of PCT/CN2015/092014 dated Jan. 19, 2016, 4 pages (English and Chinese).

* cited by examiner

*Primary Examiner* — Khanh T Nguyen
(74) *Attorney, Agent, or Firm* — Rankin, Hill & Clark LLP

(57) ABSTRACT

The invention discloses an all-aluminum back surface field aluminum paste for a crystalline silicon solar cell and a preparation method thereof. The all-aluminum back surface field paste mainly comprises 60-70% aluminum powder, 5-10% nanometer metal oily solution, 1-10% inorganic binder, 10-20% organic binder, 5-30% organic solvent and 1-5% accessory ingredient. According to the aluminum paste prepared by the present invention, the back surface preparing process of an all-aluminum back surface field can be implemented preferably; moreover, the paste has great adhesive force, is easy to be better adhered to silver paste printed afterwards; meanwhile, the paste can be in good contact with a silicon chip through the nanometer metal oily solution added into the paste, the aluminum back surface is prevented from falling off, and good ohm contact can be formed, so that the photoelectric conversion efficiency is increased, and the economic benefits of enterprises are increased.

10 Claims, No Drawings

ALL-ALUMINUM BACK SURFACE FIELD ALUMINUM PASTE FOR CRYSTALLINE SILICON SOLAR CELL AND PREPARATION METHOD THEREOF

TECHNICAL FIELD

The present invention relates to an aluminum paste for a crystalline silicon solar cell, and more particularly, to an all-aluminum back surface field aluminum paste for a crystalline silicon solar cell and a preparation method thereof.

BACKGROUND

A solar cell is a semiconductor device that can convert solar energy into electric energy, and under a light condition, the interior of the solar cell may generate a photo-generated current that can be outputted through an electrode. A negative electrode of a solar cell structure with p-silicon is usually located in the front surface of the cell while a positive electrode thereof is located in the back surface of the cell. When the light radiates, the radiation of a proper wave length leads to a hole-electron pair generated in the semiconductor. A potential difference on a P-N junction makes a hole and an electron move through the junction in an opposite direction, thus leading to the flow of current, which may transmit the electric energy to an external circuit. Currently, a commercialized crystalline silicon cell is still based on a conventional cell, having relatively simple technical process, low manufacture cost, and high cost performance, but the conventional cell has the following defects, which are mainly that ohmic contact is formed by directly printing the back electrode on a silicon wafer, and it is very easy for a silver electrode to form a metal defect in the silicon wafer, so that the electrode becomes a severe electric leakage area, which reduces the photovoltaic conversion efficiency of the solar cell; and the edge of the back electrode needs to be covered by an aluminum back surface field, which increases the width of the back electrode and the cost of the back electrode paste, and is adverse to the increase of the photoelectric conversion efficiency. In order to solve the defects generated by the manufacturing method and increase the photoelectric conversion efficiency of the silicon solar cell, the present invention provides an all-aluminum back surface field aluminum paste for a crystalline silicon solar cell and a preparation method thereof.

Chinese Patent application No. [201110208995.7] discloses a back surface field of a crystalline silicon cell and a printing technology thereof, wherein the technology mainly prints an aluminum back surface field on the back of the silicon wafer firstly, and then prints a back electrode, which can preferably solve the defects of the prior art and can increase the photoelectric conversion efficiency of the crystalline silicon cell. The patent mainly states the preparation technology of the all-aluminum back surface field, but does not describe the preparation methods of the all-aluminum back surface field aluminum paste for a crystalline silicon solar cell and the back electrode paste.

Chinese Patent [CN103151097A] discloses a preparation method of an all-aluminum back surface field paste for a crystalline silicon cell, and particularly, to a preparation method of an all-aluminum back surface field back electrode paste for a crystalline silicon cell. The paste is mainly added with a low melting cladding base metal, wherein a coating is tin or silver, and an object coated is one or several of base metals. The silver powder is enabled to form a good sintering interlay with the aluminum back surface field while improving the preparation technology of the back electrode, so that a dilatation coefficient is matched with the aluminum back surface field, the sintering interlay is not easy to crack and slab and has good electric conductivity, and the ohmic contact performance of the paste and the welding performance of a welding strip can be maximally guaranteed, so that the all-aluminum back surface field technology is completely performed. The patent mainly describes the improvement of the back electrode paste and the perfection of the technology thereof, but does not change the properties of the paste. Meanwhile, the back electrode paste has very high cost. Moreover, the adhering condition of the aluminum back surface field and the silver paste is not explained, which has essential difference with the changed aluminum paste provided by the present patent.

Chinese Patent [CN103746043A] discloses a preparation method of an all-aluminum doped solar cell, and more particularly, to a preparation method of an N-type solar cell. Firstly, an all-aluminum back surface field is prepared using a full back surface field screen printing plate not containing a back electrode figure and then is sintered under a high temperature to form a good P-N junction; and then the silver paste is sintered into the paste under a low temperature, and the back electrode is prepared through low temperature sintering, which overcomes the problem that the conventional silver aluminum paste back electrode can be only sintered under a high temperature. Because the sintering temperature of the back electrode is low, the sintering depth of the back electrode is less than the diffusion depth of the aluminum, which will not affect the quality of the P-N junction. The patent mainly describes a preparation method of an N-type all-aluminum back surface field for a solar cell. Compared with the conventional technology, the technology is added with a low temperature sintering technology, which has a conflict with a production line, and the patent does not describe a preparation method of a special silver and aluminum paste for an all-aluminum back surface field concretely. Similar patents also comprise [CN202996849U] and [CN102903765A].

Chinese Patent [CN103219062A] discloses a preparation method of a polymer thick film solder alloy conductor composition, which relates to a solder alloy powder that is composed of tin, silver, and copper with low melting point, and the prepared composition may be used to other applications that need electrical conductivity (low resistance). However, the composition is not applicable to the crystalline silicon solar cell.

BRIEF DESCRIPTION

Object of the present invention: the object of the present invention is to provide an all-aluminum back surface field aluminum paste for a crystalline silicon solar cell with respect to the foregoing solution that only refers to an all-aluminum back surface field silver paste and a preparation method of an all-aluminum back surface field crystalline silicon solar cell, but does not relate to a preparation method of an all-aluminum back surface field aluminum paste and an improvement process thereof, wherein the aluminum paste has the major characteristics that: a back aluminum formulation is changed on the basis of not changing the existing technology, so that the adhesive power with an ordinary silver paste for a crystalline silicon solar cell is improved, and the photovoltaic conversion efficiency of the crystalline silicon cell is effectively increased.

The object of the present invention may be fulfilled by employing the following technical solutions. An all-aluminum back surface field aluminum paste for a crystalline silicon solar cell comprises: 60-70% aluminum powder; 5-10% nanometer metal oily solution; 1-10% inorganic binder; 10-20% organic binder; 5-30% organic solvent; and 1-5% accessory ingredient; wherein the total mass percentage of the components thereof is 100%.

The aluminum powder is spherical aluminum powder with an average particle size of 0.8-10 μm, a purity greater than 99.8% and a span of 2.0-4.0.

The nanometer metal oily solution is an oily solution comprising one or several of nanometer aluminum, tin, aluminum-tin and aluminum-silicate, and having a purity greater than 99%.

The nanometer metal oily solution has an average particle size of 50-100 nm, and an oily solution thereof is one or two of terpineol and butyl carbitol.

The inorganic binder is core-shell glass powder which is mainly obtained by mixing low melting point glass powder and high melting point glass powder according to a mass percentage of 1:1-2:1, and then heating and smelting, cold-extracting, pulverizing and screening, wherein a shell structure of the inorganic binder is the low melting point glass powder, and a core structure is the high melting point glass powder.

The low melting point glass powder is a is a bismuth-series mixture and has a melting point of 350-450° C., the high melting point glass powder is a zinc-series mixture and has a melting point of 550-650° C., and the inorganic binder has a melting point of 480-530° C.

The inorganic binder has a particle size D50 of 2-2.5 μm and a particle size span (D90+D10)/D50 of 2-3, and has an effect of fractional melting assistance.

The accessory ingredient is a reducing accessory ingredient, which is one or several of activated carbon, nanocarbon and conductive carbon, and can prevent the paste from being oxidized too rapidly.

The organic binder is mainly mixed by resin and organic binder according to a mass percentage of 1:1-1:4, the viscosity of the organic binder obtained after being mixed and dispersed is 180-900 dpa·s, and the resin is one or several of rosin, styrax, phenolic resin, polyvinyl chloride resin, amber, shellac, polyester resin, polyamide resin and epoxy resin.

A preparation method of an all-aluminum back surface field aluminum paste for a crystalline silicon solar cell comprises the following steps:

(1) preparation of inorganic binder: adding low melting point glass powder and high melting point glass powder according to a mass percentage of 1:1-2:1 into a blender mixer to mix evenly, loading the mixture into a porcelain crucible, drying for 2 h in a drying oven under 160° C., then placing the mixture into a high temperature furnace to smelt for 1.5 h under 500° C., performing cold-extraction on the mixture, then drying, pulverizing and screening the mixture to obtain inorganic binder;

(2) preparation of organic binder: mixing resin and organic binder according to a mass percentage of 1:1-1:4, then pouring the mixture in a dispersion machine to disperse for 30~60 min to obtain transparent and even organic binder after the mixture is dispersed and dissolved, wherein the resin is one or several of rosin, styrax, phenolic resin, polyvinyl chloride resin, amber, shellac, polyester resin, polyamide resin and epoxy resin;

(3) preparation of aluminum paste: weighing 60-70% aluminum powder, 5-10% nanometer metal oily solution, 1-10% inorganic binder, 10-20% organic binder, 5-30% organic solvent and 1-10% accessory ingredient by total weight of the aluminum paste, and mixing evenly through the dispersion machine; and (4) preparation of finished product: grinding the aluminum paste mixed in step (3) through a three-roll grinder to 16-20 μm to obtain the all-aluminum back surface field aluminum paste.

In the all-aluminum back surface field aluminum paste for a crystalline silicon solar cell according to the present invention, the nanometer metal oily solution among the components thereof is beneficial for better contact between the paste and a silicon substrate, reducing the bulk phase resistance, and improving the electric conductivity, wherein the accessory ingredient is a reducing accessory ingredient which can effectively prevent the metal from being oxidized, and all the materials are mixed and processed to form the final mixed paste, which is the all-aluminum back surface field aluminum paste for a crystalline silicon solar cell of the present invention.

In conclusion, the all-aluminum back surface field aluminum paste for a crystalline silicon solar cell according to the present invention aims at the problem that directly printing the back electrode on the silicon wafer will reduce the photovoltaic conversion efficiency of the solar cell. The aluminum paste of the present invention may be printed on the crystalline silicon to form an all-aluminum back surface field using an all back surface field screen printing plate not containing a back electrode figure, which may implement the excellent implementation of the all-aluminum back surface field back surface preparing process, avoids such problems in the conventional printing technology like easy crazing and slabbing at contacts caused by pores in the back electrode after printing the aluminum paste, poor electrical conductivity, and poor adhesive power between the back electrode and the aluminum back layer; meanwhile, the adhesive power of the paste is good, and is easy to be preferably adhered to the sliver paste printed afterwards. The nanometer metal oily solution added in the paste enables the paste to have preferable contact with the silicon wafer, avoids the aluminum back surface from falling off, can form good ohmic contact, and increases the photovoltaic conversion efficiency in the meanwhile, and increases the economic benefits of enterprises.

DETAILED DESCRIPTION

The contents of the present invention will be further described hereinafter with reference to the embodiments.

The present invention provides an all-aluminum back surface field aluminum paste for a crystalline silicon solar cell, wherein the aluminum paste comprises: 60-70% aluminum powder; 5-10% nanometer metal oily solution; 1-10% inorganic binder; 10-20% organic binder; 5-30% organic solvent; and 1-5% accessory ingredient; wherein the total mass percentage of the components thereof is 100%.

The aluminum powder is spherical aluminum powder with an average particle size of 0.8-10 μm, a purity greater than 99.8% and a span of 2.0-4.0.

The nanometer metal oily solution is an oily solution comprising one or several of nanometer aluminum, tin, aluminum-tin and aluminum-silicate, and having a purity greater than 99%, and the nanometer metal oily solution has an average particle size of 50-100 nm, and an oily solution thereof is one or two of terpineol and butyl carbitol.

The inorganic binder is core-shell glass powder which is mainly obtained by mixing low melting point glass powder and high melting point glass powder according to a mass percentage of 1:1-2:1, and then heating and smelting, performing cold-extraction, pulverizing and screening, wherein a shell structure of the inorganic binder is the low melting point glass powder, and a core structure is the high melting point glass powder. The low melting point glass powder is a bismuth-series mixture, has a melting point of 350-450° C. and has an effect of preferential melting assistance, the high melting point glass powder is a zinc-series mixture, has a melting point of 550-650° C., and has an effect of deep melting assistance under a high temperature, and the inorganic binder has a melting point of 480-530° C.

The inorganic binder has a particle size D50 of 2-2.5 μm and a particle size span (D90+D10)/D50 of 2-3, and has an effect of fractional melting assistance.

The accessory ingredient is a reducing accessory ingredient, which is one or several of activated carbon, nanocarbon and conductive carbon, and can prevent the paste from being oxidized too rapidly. Meanwhile, the accessory ingredient after being fired has no residuals, is sanitary and environmentally friendly.

The organic binder is mainly mixed by resin and organic binder according to a mass percentage of 1:1-1:4, the viscosity of the organic binder obtained after being mixed and dispersed is 180-900 dpa·s, and the resin is one or several of rosin, styrax, phenolic resin, polyvinyl chloride resin, amber, shellac, polyester resin, polyamide resin and epoxy resin.

The preparation method of the aluminum paste according to the present invention will be expounded in details with reference to several embodiments hereinafter.

Embodiment 1

1. Preparation of Inorganic Binder

Preparation of inorganic binder: 60% low melting point glass powder and 40% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% phenolic resin and 80% organic solvent by total weight of the organic binder were weighed and mixed, then dispersed on a dispersion machine for 30-60 min to obtain transparent and even organic binder.

3. Preparation of all-aluminum back surface field aluminum paste for cell:

the nanometer metal oily solution was a composition obtained by mixing aluminum nano-particles, tin nano-particles and terpineol according to a mass percentage of 1:1:1; moreover, 60% aluminum powder, 5% nanometer metal oily solution, 10% inorganic binder, 10% organic binder, 10% organic solvent and 5% activated carbon accessory ingredient by mass ratio of the aluminum paste were weighed, mixed evenly by a dispersion machine, and grinded to 16-20 μm by a three-roll grinder to obtain all-aluminum back surface field aluminum paste.

The all-aluminum back surface field for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

Embodiment 2

1. Preparation of Inorganic Binder

Preparation of inorganic binder: 55% low melting point glass powder and 45% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% phenolic resin and 80% organic solvent by total weight of the organic binder were weighed and mixed, then dispersed on a dispersion machine for 30-60 min to obtain transparent and even organic binder.

3. Preparation of all-aluminum back surface field aluminum paste for cell:

the nanometer metal oily solution was a composition obtained by mixing aluminum nano-particles, tin nano-particles and terpineol according to a mass percentage of 1:1:1; moreover, 65% aluminum powder, 5% nanometer metal oily solution, 7% inorganic binder, 12% organic binder, 8% organic solvent and 3% activated carbon accessory ingredient by mass ratio of the aluminum paste were weighed, mixed evenly by a dispersion machine, and grinded to 16-20 μm by a three-roll grinder to obtain all-aluminum back surface field aluminum paste.

The stannous all-aluminum back surface field aluminum paste for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

Embodiment 3

1. Preparation of Inorganic Binder

Preparation of inorganic binder: 50% low melting point glass powder and 50% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% rosin, 20% phenolic resin and 60% organic solvent by total weight of the organic binder were weighed and mixed, then dispersed on a dispersion machine for 30-60 min to obtain transparent and even organic binder.

3. Preparation of all-aluminum back surface field aluminum paste for cell:

the nanometer metal oily solution was a composition obtained by mixing aluminum nano-particles, aluminium-tin nano-particles and terpineol according to a mass percentage of 1:1:1; moreover, 62% aluminum powder, 5% nanometer metal oily solution, 8% inorganic binder, 12% organic binder, 8% organic solvent and 5% activated carbon accessory ingredient by mass ratio of the aluminum paste were weighed, mixed evenly by a dispersion machine, and grinded to 16-20 μm by a three-roll grinder to obtain all-aluminum back surface field aluminum paste.

The stannous all-aluminum back surface field aluminum paste for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

Embodiment 4

1. Preparation of Inorganic Binder

Preparation of inorganic binder: 65% low melting point glass powder and 35% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% phenolic resin and 80% organic solvent by total weight of the organic binder were weighed and mixed, then dispersed on a dispersion machine for 30-60 min to obtain transparent and even organic binder.

3. Preparation of all-aluminum back surface field aluminum paste for cell:

the nanometer metal oily solution was a composition obtained by mixing aluminum nano-particles, aluminum-silicate nano-particles and terpineol according to a mass percentage of 1:1:1; moreover, 60% aluminum powder, 6% nanometer metal oily solution, 7% inorganic binder, 11% organic binder, 12% organic solvent and 3% activated carbon accessory ingredient by mass ratio of the aluminum paste were weighed, mixed evenly by a dispersion machine, and grinded to 16-20 μm by a three-roll grinder to obtain all-aluminum back surface field aluminum paste.

The stannous all-aluminum back surface field aluminum paste for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

Embodiment 5

1. Preparation of Inorganic Binder

Preparation of inorganic binder: 60% low melting point glass powder and 40% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% rosin, 20% phenolic resin and 60% organic solvent by total weight of the organic binder were weighed and mixed, then dispersed on a dispersion machine for 30-60 min to obtain transparent and even organic binder.

3. Preparation of all-aluminum back surface field aluminum paste for cell:

the nanometer metal oily solution was a composition obtained by mixing aluminum nano-particles, aluminum-tin nano-particles, aluminum-silicate nano-particles and terpineol according to a mass percentage of 1:1:1:1; moreover, 62% aluminum powder, 5% nanometer metal oily solution, 8% inorganic binder, 12% organic binder, 8% organic solvent and 5% activated carbon accessory ingredient by mass ratio of the aluminum paste were weighed, mixed evenly by a dispersion machine, and grinded to 16-20 μm by a three-roll grinder to obtain all-aluminum back surface field aluminum paste.

The stannous all-aluminum back surface field aluminum paste for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

Embodiment 6

1. Preparation of Inorganic Binder

Preparation of inorganic binder: 50% low melting point glass powder and 50% high melting point glass powder by total weight of the inorganic binder were weighed and mixed evenly by a blender mixer, then the mixture was loaded into a porcelain crucible, dried for 2 h in a drying oven under 160° C., then placed into a high temperature furnace to smelt for 1.5 h under 500° C., subjected to cold-extraction, then dried, pulverized and screened.

2. Preparation of organic binder: 20% phenolic resin and 80% organic solvent by total weight of the organic binder were weighed and mixed, then dispersed on a dispersion machine for 30-60 min to obtain transparent and even organic binder.

3. Preparation of all-aluminum back surface field aluminum paste for cell:

70% nanometer metal oily solution was a composition obtained by mixing aluminum nano-particles, aluminium-tin nano-particles, aluminum-silicate nano-particles and terpineol according to a mass percentage of 1:1:1:1; moreover, 70% aluminum powder, 6% nanometer metal oily solution, 6% inorganic binder, 12% organic binder, 8% organic solvent and 3% activated carbon accessory ingredient by mass ratio of the aluminum paste were weighed, mixed evenly by a dispersion machine, and grinded to 16-20 µm by a three-roll grinder to obtain all-aluminum back surface field aluminum paste.

The stannous all-aluminum back surface field aluminum paste for a crystalline silicon solar cell prepared above was silk-screen printed on a 156 mm×156 mm polycrystalline silicon wafer to form an all-aluminum back surface through a 250-mesh backless electrode screen printing plate, and fed into a muffle furnace to dry under 240° C. The all-aluminum back surface was not dropped after being dried, then a back electrode was printed at the all-aluminum back surface, dried in the muffle furnace to dry under 220° C., then front surface silver paste was printed on the other side, fed in an infrared fast-sintering meshbeltfurnace to sinter under 790-810° C., while the performances of the paste prepared were tested to satisfy the requirements.

The performances of the products obtained in the five embodiments above were tested, wherein the results were as shown in Table 1:

TABLE 1

| Performance index | Embodiment 1 | Embodiment 2 | Embodiment 3 | Embodiment 4 | Embodiment 5 | Embodiment 6 |
| --- | --- | --- | --- | --- | --- | --- |
| Contact resistance/mΩ-cm² | 7.5 | 6.3 | 7.1 | 8.3 | 6.0 | 5.3 |
| Adhesive performance between aluminum layer and back | 4.5 | 5.1 | 5.0 | 3.1 | 5.2 | 5.1 |
| Adhesive performance between aluminum | No slabbing | No slabbing | No slabbing | No slabbing | No slabbing | No slabbing |
| Boiling resistance | No bubbles in the coating and no ash | No bubbles in the coating and no ash | No bubbles in the coating and no ash | No bubbles in the coating and no ash | No bubbles in the coating and no ash | No bubbles in the coating and no ash |

The invention claimed is:

1. A preparation method of an all aluminum back surface field aluminum paste for a crystalline silicon solar cell, comprising the following steps:
   (1) preparation of inorganic binder: adding low melting point glass powder and high melting point glass powder according to a mass percentage of 1:1-2:1 into a blender mixer to mix evenly, loading the mixture into a porcelain crucible, drying for 2h in a drying oven under 160° C., then placing the mixture into a high temperature furnace to smelt for 1.5h under 500° C., performing cold-extraction on the mixture, then drying, pulverizing and screening the mixture to obtain inorganic binder;
   (2) preparation of organic binder: mixing resin and organic binder according to a mass percentage of 1:1-1:4, then pouring the mixture in a dispersion machine to disperse for 30~60 min to obtain transparent and even organic binder after the mixture is dispersed and dissolved, wherein the resin is one or several of rosin, styrax, phenolic resin, polyvinyl chloride resin, amber, shellac, polyester resin, polyamide resin and epoxy resin;
   (3) preparation of aluminum paste: weighing 60-70% aluminum powder, 5-10% nanometer metal oily solution, 1-10% inorganic binder, 10-20% organic binder, 5-30% organic solvent and 1-10% accessory ingredient by total weight of the aluminum paste, and mixing evenly through the dispersion machine; and
   (4) preparation of finished product: grinding the aluminum paste mixed in step (3) through a three-roll grinder to 16~20 µm to obtain the all-aluminum back surface field aluminum paste.

2. The preparation method according to claim 1, wherein the all-aluminum back surface field aluminum paste obtained in the step (4) comprises:
   60-70% aluminum powder;
   5-10% nanometer metal oily solution;
   1-10% inorganic binder;
   10-20% organic binder;
   5-30% organic solvent; and
   1-5% accessory ingredient;
   wherein the total mass percentage of the components thereof is 100%.

3. The preparation method according to claim 2, wherein the aluminum powder is spherical aluminum powder has an average particle size of 0.8-10 µm, a purity greater than 99.8% and a span of 2.0-4.0.

4. The preparation method according to claim 3, wherein the nanometer metal oily solution has an average particle size of 50-100 nm, and an oily solution thereof is one or two of terpineol and butyl carbitol.

5. The preparation method according to claim 2, wherein the nanometer metal oily solution is an oily solution comprising one or several of nanometer aluminum, tin, aluminum-tin and aluminum-silicate, and having a purity greater than 99%.

6. The preparation method according to claim 2, wherein the inorganic binder is core-shell glass powder which is mainly obtained by mixing low melting point glass powder and high melting point glass powder according to a mass percentage of 1:1-2:1, and then heating and smelting, performing cold-extraction, pulverizing and screening, wherein a shell structure of the inorganic binder is the low melting point glass powder, and a core structure is the high melting point glass powder.

7. The preparation method according to claim 6, wherein the low melting point glass powder is a bismuth-series mixture and has a melting point of 350-450° C., the high melting point glass powder is a zinc-series mixture and has a melting point of 550-650° C., and the inorganic binder has a melting point of 480-530° C.

8. The preparation method according to claim 2, wherein the inorganic binder has a particle size D50 of 2-2.5 µm and a particle size span (D90+D10)/D50 of 2-3, and has an effect of fractional melting assistance.

9. The preparation method according to claim 2, wherein the accessory ingredient is a reducing accessory ingredient, which is one or several of activated carbon, nanocarbon and conductive carbon, and can prevent the paste from being oxidized too rapidly.

10. The preparation method according to claim 2, wherein the organic binder is mainly mixed by resin and organic binder according to a mass percentage of 1:1-1:4, the viscosity of the organic binder obtained after being mixed and dispersed is 180-900 dpa·s, and the resin is one or several of rosin, styrax, phenolic resin, polyvinyl chloride resin, amber, shellac, polyester resin, polyamide resin and epoxy resin.

\* \* \* \* \*